United States Patent
Baumecker et al.

(10) Patent No.: US 6,196,154 B1
(45) Date of Patent: Mar. 6, 2001

(54) AIR LOCK FOR INTRODUCING SUBSTRATES TO AND/OR REMOVING THEM FROM A TREATMENT CHAMBER

(75) Inventors: Tomas Baumecker, Bruchköbel; Helmut Grimm, Darmstadt; Jürgen Henrich, Limeshain; Klaus Michael, Gelnhausen; Gert Rödling, Obertshausen; Jürgen Ulrich, Schöneck, all of (DE)

(73) Assignee: Leybold Systems GmbH, Hanau (DE)

( * ) Notice: Subject to any disclaimer, the term of this patent is extended or adjusted under 35 U.S.C. 154(b) by 0 days.

(21) Appl. No.: 09/249,445

(22) Filed: Feb. 12, 1999

(30) Foreign Application Priority Data

Feb. 19, 1998 (DE) ................................. 198 07 031
Feb. 19, 1998 (DE) .......................................... 298 02 947 U

(51) Int. Cl.⁷ ............................. C23C 16/00; C23C 14/56
(52) U.S. Cl. .................................. 118/723 VE; 118/719; 118/718; 204/298.25; 414/217; 414/219; 414/220; 222/367; 222/368
(58) Field of Search ......................... 204/298.25, 298.35; 156/345; 118/719, 718, 723 VE; 414/217, 219, 220, 937, 939, 935; 222/368, 367

(56) References Cited

U.S. PATENT DOCUMENTS

| | | | |
|---|---|---|---|
| 812,154 | * | 2/1906 | Scott et al. ............................ 414/219 |
| 1,808,017 | * | 6/1931 | Chapman ............................... 414/219 |
| 1,969,771 | * | 8/1934 | Young .................................... 414/219 |
| 2,393,997 | * | 2/1946 | Lehmann .............................. 414/219 |
| 2,585,472 | * | 2/1952 | Kennedy ............................... 414/219 |
| 2,688,416 | * | 9/1954 | Skretting .............................. 414/219 |
| 2,858,212 | * | 10/1958 | Durnat et al. ........................ 414/219 |
| 2,960,245 | * | 11/1960 | Knapp ................................... 414/219 |

(List continued on next page.)

FOREIGN PATENT DOCUMENTS

| | | |
|---|---|---|
| 24 54 544 | 7/1975 | (DE) . |
| 37 35 284 | 4/1989 | (DE) . |
| 196 24 609 | 1/1998 | (DE) . |
| 196 26 861 | 1/1998 | (DE) . |
| 03 54 294 | 2/1990 | (EP) . |
| 14 96 205 | 8/1996 | (FR) . |

(List continued on next page.)

Primary Examiner—Jeffrie R. Lund
(74) Attorney, Agent, or Firm—Smith, Gambrell & Russell, LLP

(57) ABSTRACT

In an air lock for continuous introduction into and/or removal of workpieces from spaces (1,4) separated atmospherically, the individual substrates (3,13) are transported through a transfer channel (24). At least one lock chamber (7a–7m) serving to accommodate the substrates (3,13) is arranged movably in the transfer channel (24). During the substrate transport in the transfer channel (24), the lock chamber (7a–7m) is atmospherically separated both from the exterior (1) having normal pressure and from the coating chamber (4). The air lock (2) includes a carrousel lock which has a carrousel housing (24) and a lock chamber wheel (10). On the periphery in the lock chamber wheel (10) individual lock chambers (7a–7m) are provided, in which the workpieces (3,13) to be brought into the chamber to be loaded (4) are inserted freely accessible on the normal pressure side. By turning the lock chamber wheel (10), the substrates (3,13) in the lock chambers (7a–7m) are transported from the coating station (A) to the transfer station (B) into the treatment chamber (4) diametrically opposite the normal pressure side. In the transfer station (B) the substrates (3,13) are removed from the transfer channels (7a–7m) by means of a transfer device (17') and are available for further treatment in the treatment chamber (4). The treatment chamber (4) includes, for instance, of a vacuum-coating chamber in which the workpieces (3,13) as the substrates to be coated are coated by a vacuum-supported coating method.

9 Claims, 6 Drawing Sheets

U.S. PATENT DOCUMENTS

| | | | | |
|---|---|---|---|---|
| 3,219,393 | * | 11/1965 | Starrett | 414/219 |
| 3,556,355 | * | 1/1971 | Ruiz | 222/368 |
| 4,179,043 | * | 12/1979 | Fischer | 222/368 |
| 4,180,188 | * | 12/1979 | Aonuma et al. | 222/368 |
| 4,268,205 | * | 5/1981 | Vacca et al. | 414/219 |
| 5,405,231 | * | 4/1995 | Kronberg | 414/220 |
| 5,521,351 | * | 5/1996 | Mahoney | 219/121.59 |
| 5,630,691 | * | 5/1997 | Newbolt | 414/219 |
| 6,086,728 | * | 7/2000 | Schwartz et al. | 204/192.12 |

FOREIGN PATENT DOCUMENTS

| | | |
|---|---|---|
| 62-164881 | 1/1988 | (JP) . |
| 5-331642 | 3/1994 | (JP) . |
| 09041143 | 3/1995 | (JP) . |
| 09143729 | 11/1995 | (JP) . |

* cited by examiner

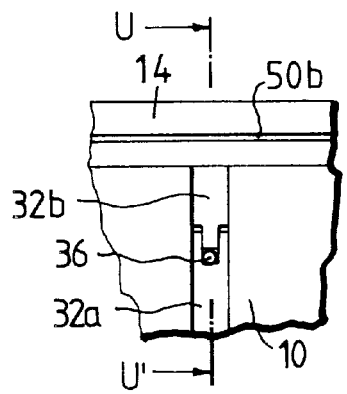
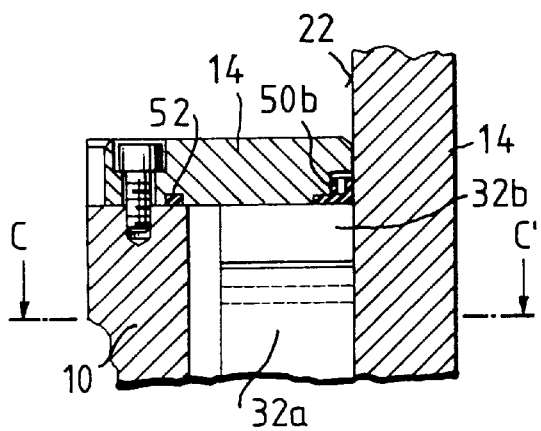
FIG.9  FIG.10
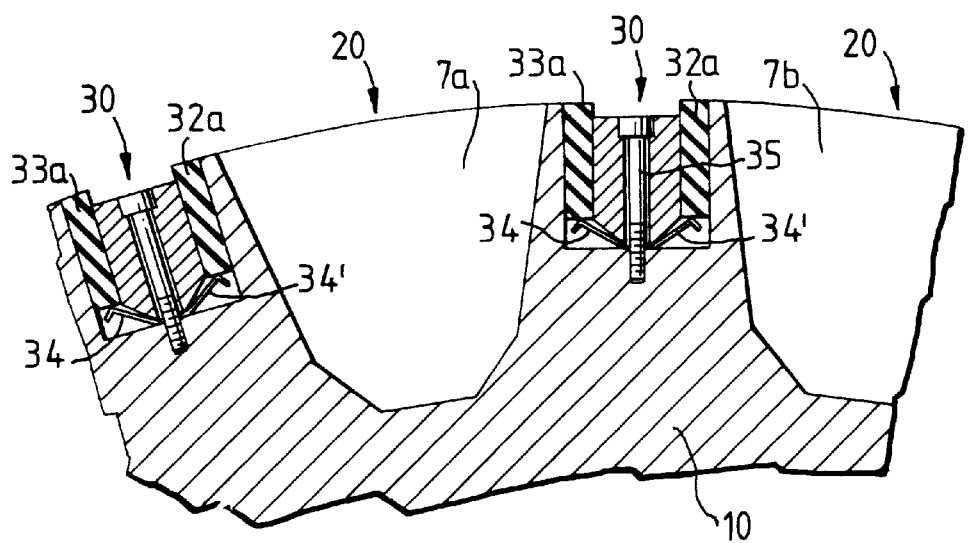
FIG.11

AIR LOCK FOR INTRODUCING SUBSTRATES TO AND/OR REMOVING THEM FROM A TREATMENT CHAMBER

INTRODUCTION AND BACKGROUND

The present invention pertains to an air lock for introducing workpieces to and/or removing them from atmospherically separated chambers with at least one transfer channel connecting the chambers.

Air locks of this class are known, for instance, from German Patent Application No. P 27 47 061. This conventional air lock serves to introduce endless carrier belts which are to be coated in a vacuum chamber by means of the air lock from the surrounding outer area having normal pressure into the coating chamber and removing them from the coating chamber after the coating process is finished. The pressure difference between the external atmospheric pressure and the usual vacuum pressure for vacuum-supported coating processes of at most $10^{-3}$ mbar is maintained over a pressure stage path which features several shutters arranged in succession, through which the carrier belt is guided. Essential elements of these so-called belt transfer channels, which bridge the pressure difference with respect to the pressure in the actual coating chamber, are the shutters constructed as slits or gaps, which oppose a significant resistance to air flow, so that the desired pressure differential is possible using vacuum pumps.

In order to guarantee a sufficient atmospheric separation between the coating chamber and the outer chamber, it is necessary to adapt the shutters to the profile of the carrier belt in order to prevent the passage, for instance, of air into the coating chamber.

Another restriction of such an air lock is that the carrier belt itself is necessary for the sealing function of the shutters, so that it is necessary that the carrier belt be led through the air lock exclusively in an endless manner in order to prevent a rise of pressure in the coating chamber. This sharply restricts the use of this known air lock in regard to the workpieces that can be transported through the transfer channel.

An object of the present invention is to create an air lock for this technology that permits a continuous transport of workpieces between two chambers, the two chambers being atmospherically separated from one another, but does not display the disadvantageous restrictions mentioned above.

SUMMARY OF THE INVENTION

The above and other objects of the invention can be attained in that the atmospherically separated chambers are connected by a transfer channel, in which at least one lock chamber accommodating the workpiece to be transferred is arranged movably between the chambers, and wherein the lock chamber features an opening for loading and unloading the workpieces and at least one sealing device, by means of which the lock chamber interior is atmospherically sealed off from the adjacent spaces.

The air lock according to the invention is suited to transfer the workpieces between chambers with identical atmospheric pressure as well as between chambers which have different atmospheric pressures.

A particular advantage results if one of the chambers has normal atmospheric pressure and the other chamber has a negative atmospheric pressure. Since the negative pressure is maintained during the transfer of the workpieces into or out of the negative pressure chamber, the coating processes performed in the negative pressure chamber requiring a vacuum pressure can be performed continuously. The exposure to air and subsequent evacuation of the vacuum chamber, in particular, for introducing or removing the workpieces to be treated, are not necessary according to the invention. With the air lock according to the invention it is thus possible to transport the workpieces into the chamber having atmospheric characteristics differing from the exterior space or out of it in an efficient manner which is favorable in terms of cost and time.

In practice, a vacuum-coating chamber which had a negative atmospheric pressure of at most $10^{31}$ mbar during the coating process was successfully loaded by means of the air lock according to the invention with workpieces to be coated from the exterior space at normal pressure, or unloaded with the workpieces (substrates) that had been coated in the vacuum-coating chamber. Representative workpieces are beverage containers but any suitable workpiece is contemplated herein.

A particularly simple design of the air lock results wherein the air lock comprises a carrousel lock formed essentially of a carrousel housing and a lock chamber wheel seated so as to be able to rotate in the carrousel housing. Individual lock chambers whose individual openings are accessible in the radial direction are inserted or formed into the lock chamber wheel on the periphery. The carrousel housing constituting the transfer channel has sealing devices at its periphery which make sealing contact with the inside wall of the transfer channel during material transport, whereby the individual chambers are atmospherically separated from one another and, for instance, from the atmospheric spaces having different atmospheric pressures. It has proven to be of advantage to adapt the individual lock chambers in terms of pressure via a pressure stage during their transition from the space under higher pressure to the space under lower pressure, in order to prevent the introduction of atmospheric gas into the vacuum chamber. To this end, it is provided that the lock chambers be evacuated by means of suitable pumps, for instance, vacuum pumps. The transfer channel is also connected via several suction connectors to vacuum pumps. The design of the vacuum pumps is selected such that the atmospheric pressure in the transfer channel decreases or increases continuously or step by step. The individual, mutually adjacent transfer channels thus exhibit different pressures as a function of their position.

The sealing devices arranged between lock chambers and the inside wall of the transfer housing are formed of slide sealing elements which make a seal on the periphery of the lock chamber wheel and of radial gaskets which are arranged continuously and, for instance, in one piece as a gasket belt running peripherally on the transfer channel rim and prevent the passage of atmospheric air in the radial direction of the transfer channel wheel. The gasket unit is advantageously constructed as a dry gasket, which avoids the use of lubricants. To this end, it is proposed to employ slides of a wear-resistant elastic synthetic polymeric material, for instance, Teflon®.

Loading devices which are preferably arranged diametrically to one another and adjacent to the lock chamber wheel in the atmospherically mutually separated spaces are provided for loading and unloading the lock chambers. These loading/unloading devices each have gripping devices which, for instance, convey the untreated substrates into the lock chambers for transfer into a treatment chamber and which convey the treated substrates into the individual lock chambers for outwards transfer.

Furthermore, it is proposed to employ the air lock according to the invention for transferring substrates to be coated by means of a vacuum-coating process into/out of a coating chamber having a coating source. Suitable coating sources are known vaporization sources and/or sputtering cathodes for generating a cloud of vaporized and/or sputtered coating material for deposition onto the substrates to be coated. The substrates can include plastic containers such as bottles, on the outer wall of which a blocking layer which is optically transparent but impervious to the passage of gases or fluids is deposited. To this end, silicon-containing source material is vaporized and/or sputtered by means of the vaporization or sputtering cathode source and then reacted with a reaction gas containing oxygen which is introduced into the coating chamber, reacts and deposits as an $SiO_2$ layer on the plastic containers.

BRIEF DESCRIPTION OF THE DRAWINGS

The present invention will be further understood from the accompanying drawings, wherein:

FIG. 9 is an enlarged representation of a partial cutout of the circumference of the transfer channel wheel with sealing device;

FIG. 10 a partial sectional view along line U—U' in FIG. 9; and

FIG. 11 is a cutout view of the lock chamber wheel according to FIG. 2 in an enlarged representation with lock chamber and associated sealing devices.

DETAILED DESCRIPTION OF INVENTION

Figure 1:
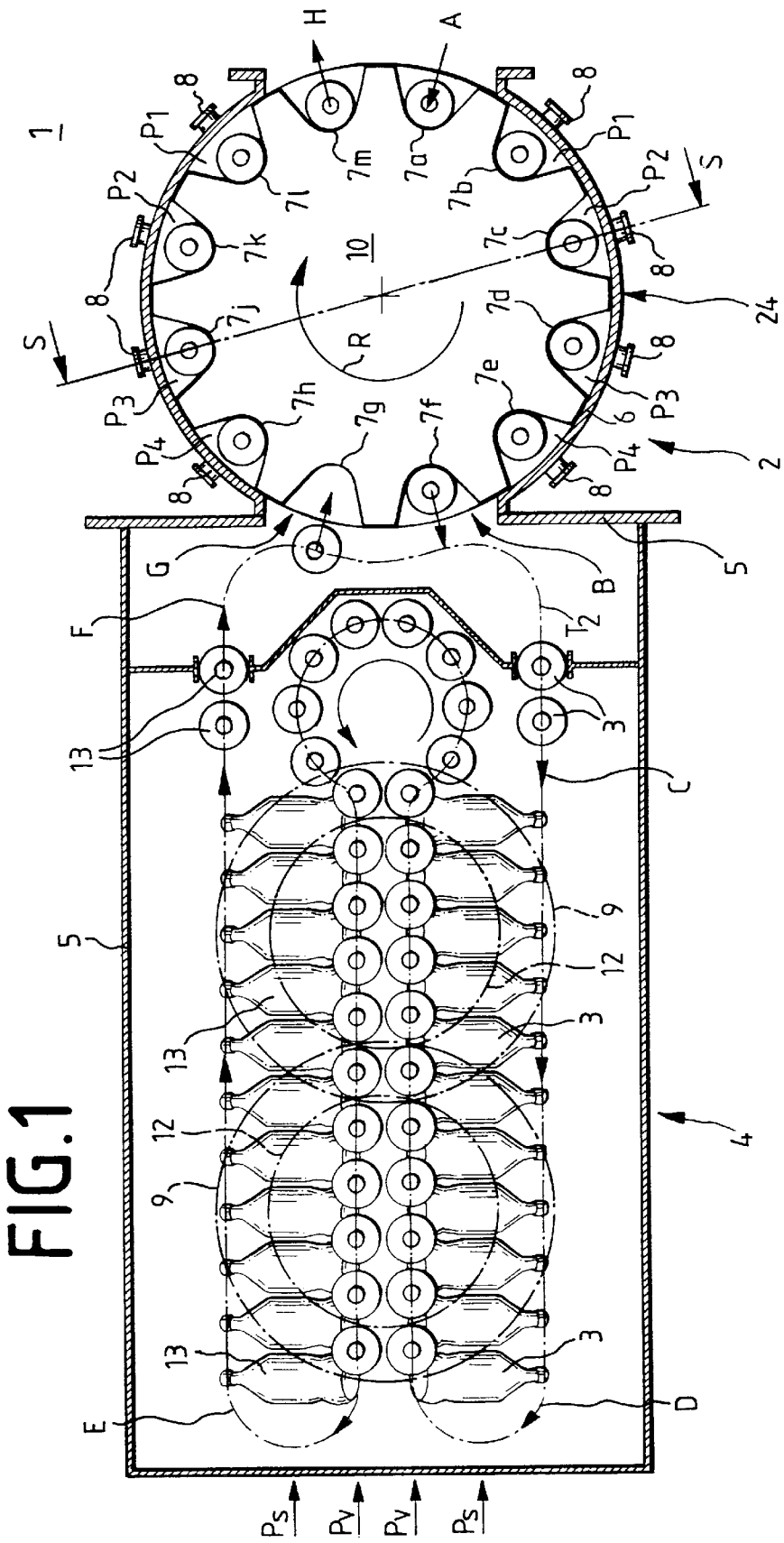
FIG. 1 is a longitudinal sectional view through an air lock with adjacent treatment chamber, as well as with a schematically illustrated transport path of the workpieces in the treatment chamber according to the invention.
Figure 2:
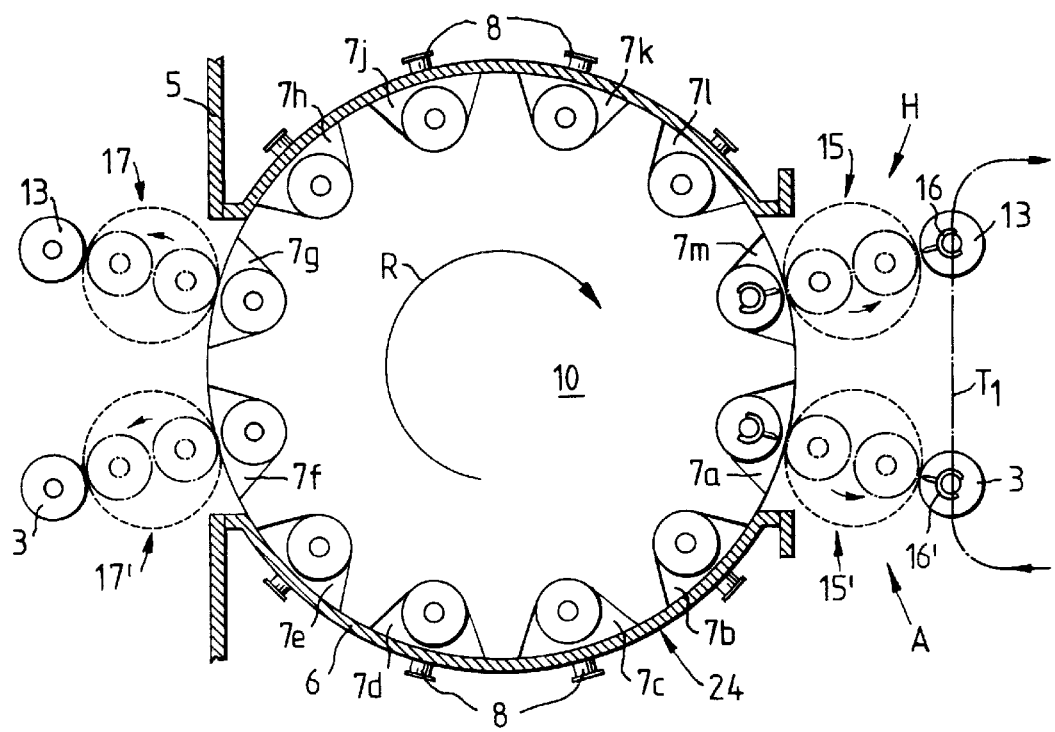
FIG. 2 is a partial sectional view of the air lock according to FIG. 1 with lock chamber wheel with associated loading devices with two loaded lock chambers.
Figure 3:
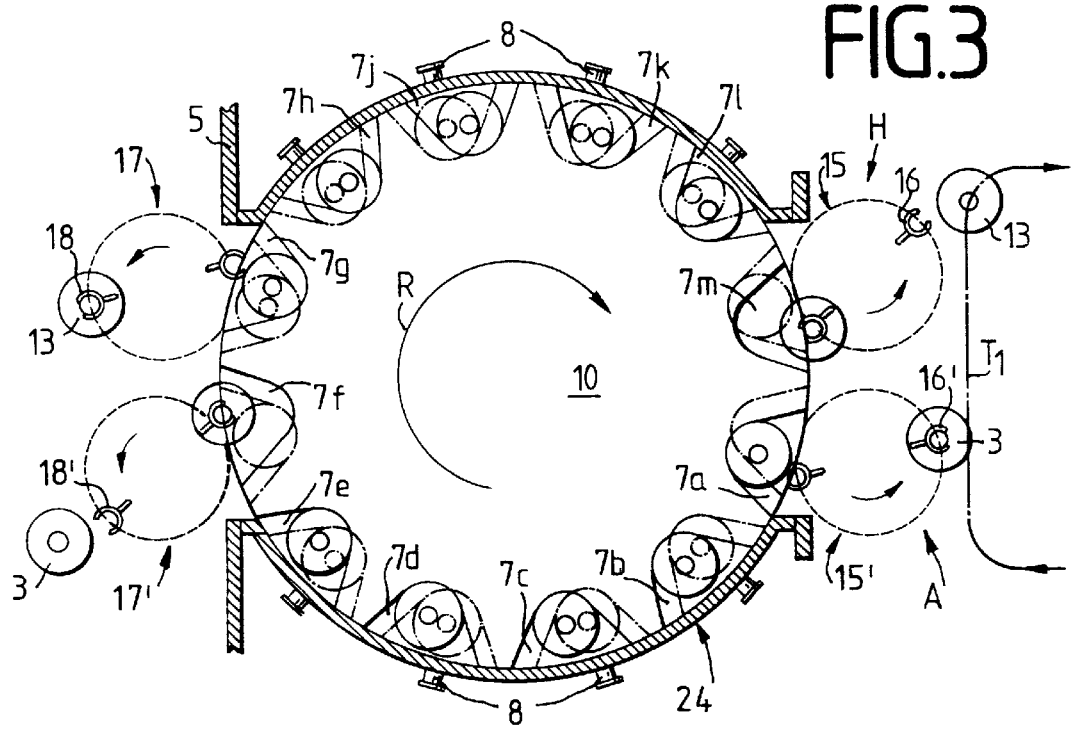
FIG. 3 is a partial sectional view according to FIG. 2 in a transport moment in a further advanced cycle of the transfer channel wheel and the loading units.
Figure 4:
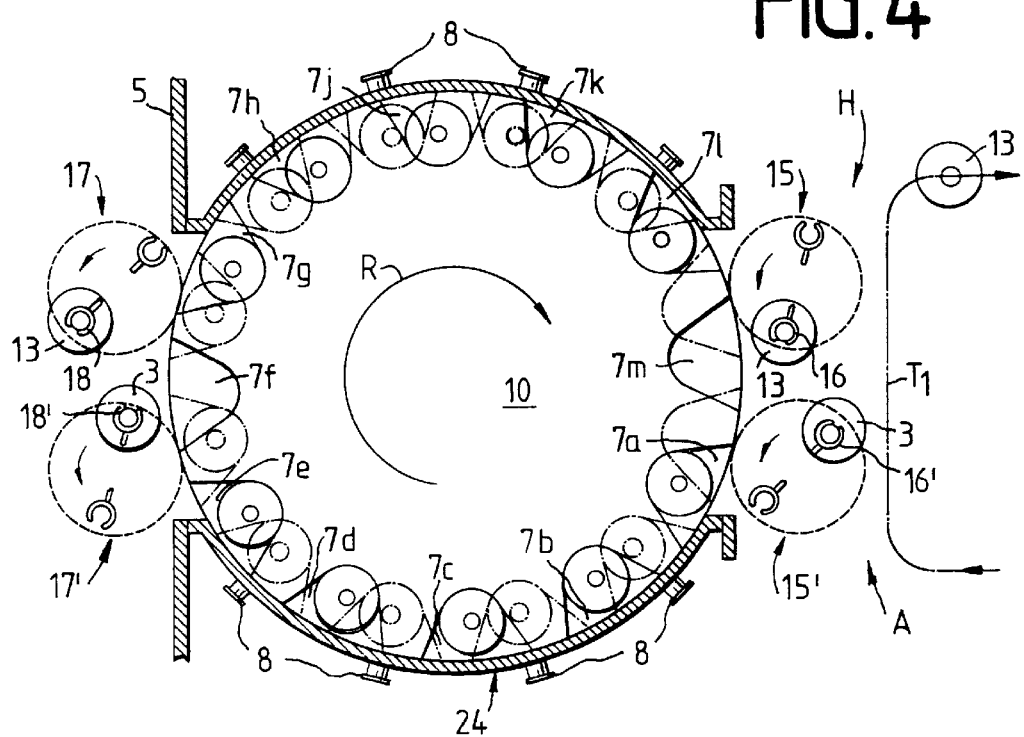
FIG. 4 is a partial sectional view according to FIG. 3 in a further advanced transport position.
Figure 5:
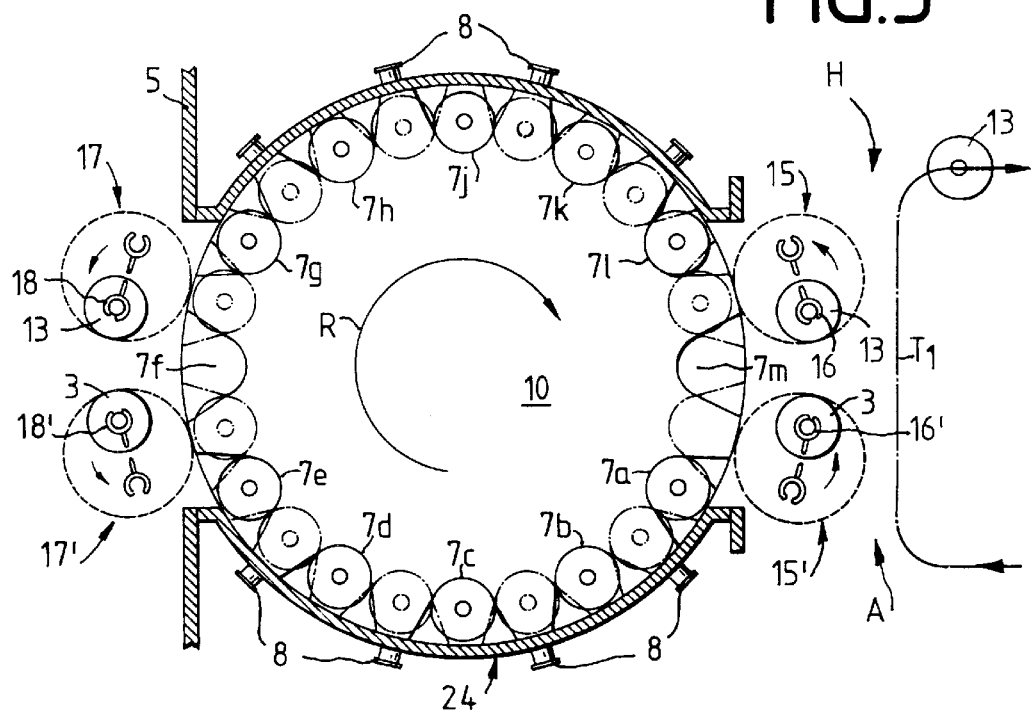
FIG. 5 is a partial sectional view according to FIG. 4 in a further advanced transport position.
Figure 6:
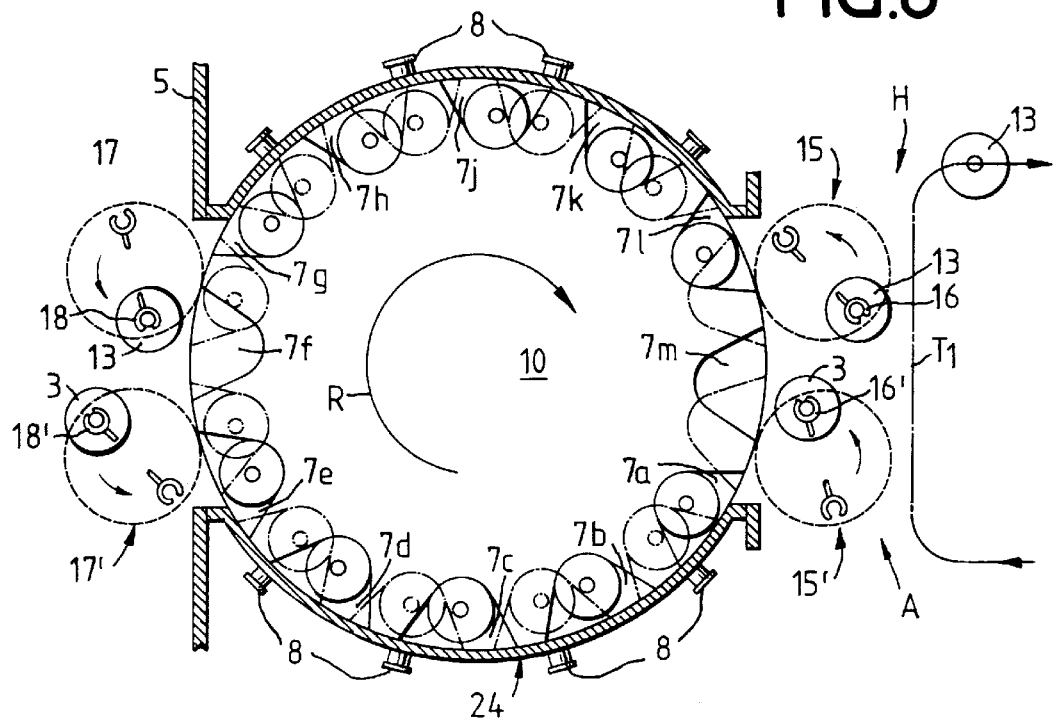
FIG. 6 is a partial sectional view according to FIG. 5 in a further advanced transport position.
Figure 7:
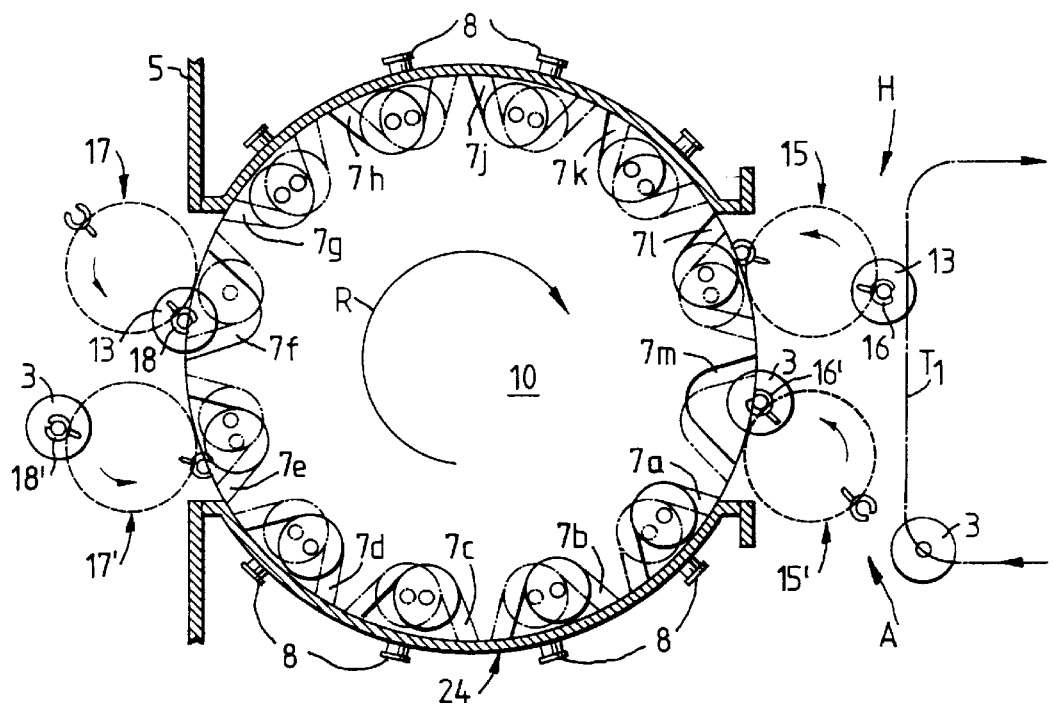
FIG. 7 is a partial sectional view according to FIG. 6 in a further advanced transport position.

Referring to FIG. 1, the air lock 2 for continuous introduction and/or removal of workpieces in and/or from atmospherically separated spaces 1,4 comprises a transfer channel 6 constructed as a carrousel housing 24 and connecting a treatment space 4 for processing the substrates 3,13 to the exterior 1. The air lock 2 comprises, alongside the carrousel housing 24, a lock chamber wheel 10 seated therein free to rotate, in which individual lock chambers 7a–7m are built on the periphery and equally spaced from one another.

For transferring the workpieces 3 from the exterior 1 into the treatment space 4, the individual workpieces 3 in the loading station A drawn in FIGS. 2–7 are brought via the transport path $T_1$ (see FIG. 2) to the loading station A arranged in the exterior 1. The loading station A comprises a handling mechanism for transfer action 15' with which a gripping device 16' is associated. By means of the gripping device 16', the substrate 3 brought up via the transport path $T_1$ is preferably seized at the end and positioned by a simultaneously occurring radially directed extension motion of the gripping device 16' and a 180° rotation of the transfer handling mechanism 15' opposite an empty lock chamber 7a.

The substrate 3 is then brought through the lock chamber opening 20 (see FIG. 11) into the lock chamber 7a by an extension motion of the gripping device 16' oriented in the direction of the lock chamber 7a.

Simultaneously, a coated substrate 13 is removed from the lock chamber 7m in an analogous manner, but with an opposite motion sequence, by means of the transfer handling mechanism 15 and the associated gripping device 16. For transport of the substrate 3 or 13 brought into the lock chambers 7a–7m in the direction of the vacuum chamber 4 or in the direction of the exterior 1, the lock chamber wheel 10 turns according to the rotational direction R illustrated in FIGS. 1–8. For adapting the pressure in the lock chambers 7a–7m to that in the area of the transfer stations A and H and B and G, respectively, the carrousel chamber 24 is connected via suction connectors 8 arranged radially distributed over the periphery to vacuum pumps (not shown).

The design of the individual pumps is made such that the pressures $P_1$, $P_2$, $P_3$, $P_4$ (see FIG. 1) decrease in numerical order. Since the individual lock chambers 7a–7m are completely separated atmospherically from one another by means of sealing devices 30, 32, 33, 34, 35, 36 (see FIG. 11) and simultaneously from the exterior 1 and from the treatment space 4, each six lock chambers 7a–7f or 7g–7m form a so-called pressure-stage series, which effectively prevents the intrusion of the atmospheric air prevailing in the exterior 1 into the treatment chamber 4 and simultaneously permits the transport of substrate 3 or 13 into or out of the treatment chamber 4 into the exterior 1 at constant atmospheric pressure in the treatment chamber 4.

The substrates 3 transferred into the treatment space 4 are fed in the transfer station via a transport belt, not shown in the figures, in a manner analogous to that in the loading station A or the unloading station H. The transport belt passes through the transport path $T_2$, which is reproduced by a segmented line in FIG. 1. The substrates 3, detachably fastened to the transport belt by means of, for instance, a pivoting mount device, are moved along the transport path $T_2$ in front of individual treatment stations.

In the embodiment shown in FIG. 1, the treatment stations comprise individual coating sources, not shown, for the vacuum coating. These coating sources, for instance, vaporization sources or cathodic sputtering sources, generate a radially symmetrical density distribution 9 of the vaporized or sputtered coating material in a known manner. Corresponding to the emission characteristic, dependent on the process parameters of the coating source and on the coating material, so-called 25%-density and 50%-density distributions 9,12 are formed as illustrated in FIG. 1.

In order to guarantee a uniform, homogeneous coating of the substrates 3,13 both on their outer wall surfaces and on their bottom surface, the substrates 3,13 are first oriented in a wall coating position at an incline to the coating sources preferably arranged at the bottom of the coating chamber 4. During the transport of the substrates 3,13 in the wall coating position $P_s$, the substrates 3,13 are first rotated about their longitudinal axis in order to guarantee an all-round coating.

After the coating of the wall surfaces has been accomplished, the transport path $T_2$ turns by 180° with a turning unit (not shown in FIG. 1), the substrates 3, 13 being simultaneously transferred from an inclined coating position $P_s$ into a vertical coating position $P_v$. With their bottom surfaces oriented facing towards the coating sources, the substrates are led past the coating sources, and, as represented in FIG. 1, the substrates 3,13 now being coated above the substrates 3,13 in the wall-coating position $P_s$ simultaneously being coated.

After passing through the transport path $T_2$ in the bottom-coating position $P_v$, the substrates 3,13 are moved along by a turning device in a bottom-coating position Pv parallel to but opposite the first bottom-coating position $P_v$. Following this coating phase, the transport path again turns by 180°, which is followed by a final coating phase, through which the substrates 3 now pass in a wall-coating position $P_s$.

The coated substrates 13 are transported by the transport belt along the transport path $T_2$ to the transfer station G. After transferring the substrates 13 into the lock chambers 7a–7m of the lock chamber wheel 10, the substrates 13 are moved by rotation of the lock chamber wheel 10 in the rotational direction R to the unloading station H where they are fed to the transport path $T_1$. by means of the transfer handling machine 15 and the gripping device 16, illustrated in FIGS. 2–7, in the manner described above (see FIG. 2).

Figure 8:
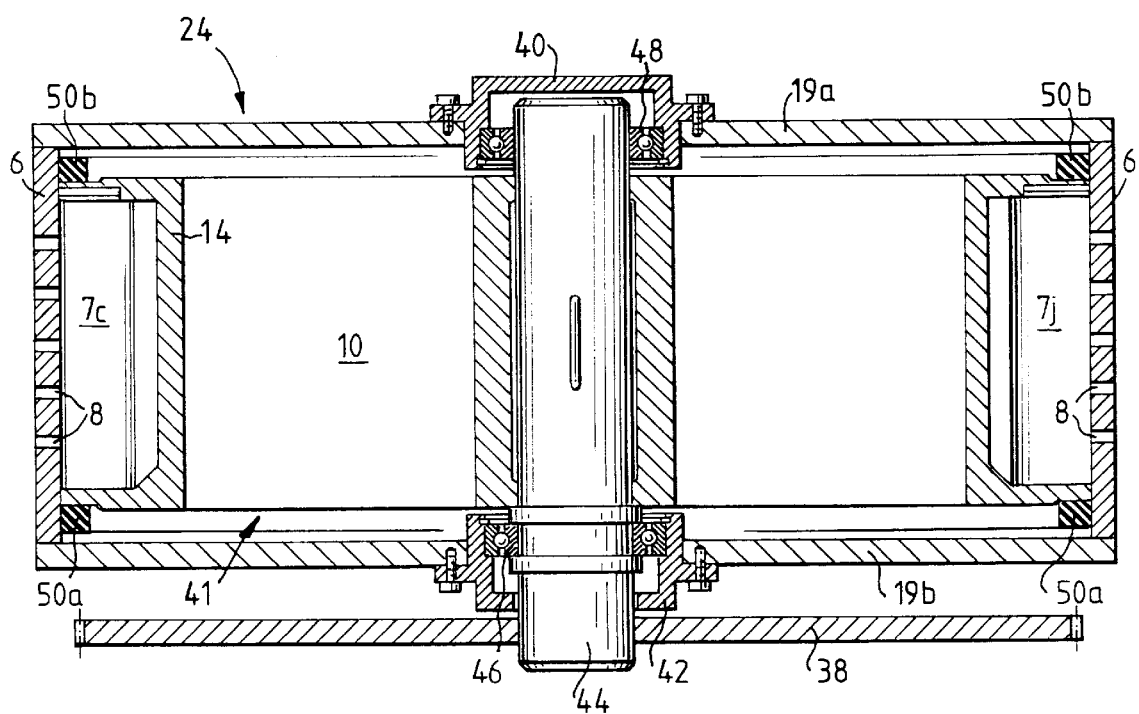
FIG. 8 is a sectional view along line S—S through the carrousel lock according to FIG. 1.

The construction of the air lock 2 as a carrousel lock can be understood from FIG. 8. The air lock 2 essentially consists of the carrousel housing 24, in which the lock chamber wheel 10 is seated so as to rotate on a shaft 44. The shaft 44 is held by means of bearings 48 and 46 fit into bearing housings 40 and 42, respectively. Individual lock chambers 7a–7m, diametrically opposing one another and arranged equally spaced over the periphery of the lock chamber wheel 10, are formed in the lock chamber wheel 10.

As is evident from FIG. 8, the lock chambers 7c and 7j, representing the other lock chambers, are separated tight against atmospheric pressure and, in particular, vacuum-tight, preferably, high-vacuum-tight, by means of sealing devices 34,34',36,32a,32b,50a,50b from the transfer channel 41. The sealing devices 34,34',36,32a,32b,50a,50b consist of radial gaskets 50a,50b formed respectively above and below the individual lock chambers 7c and 7j which, as illustrated in FIGS. 9 and 10, seal atmospherically on the one hand against the inside wall of the transfer channel 22 and, on the other hand, against slides 32b that are arranged tight with the lock chamber wheel 10 and adjacent to the lock chambers 7a–7m. The slide 32b is guided in a gate formed in an associated slide 32a wherein, by means of an elastically deformable compensation element 36 between the slider 32a and the slider 32b, the latter are held elastically tight in contact.

The slides 32a and 32b are pressed radially outward by spring elements 34,34' (see FIG. 11) which are held in place in the lock chamber wheel 10 by a screw 35, whereby the slides 32a,32b are held in dynamically sealing contact with the inside wall 22 of the lock chamber even during rotation of the lock chamber wheel 10. By the sealing devices 34,34',36,32a,32b,50a,50b it is therefore guaranteed that the individual lock chambers 7a,7b, . . . are mutually separated during the transfer process atmospherically and are sufficiently vacuum-tight.

Further variations and modifications of the foregoing will be apparent to those skilled in the art and are intended to be encompassed by the claims appended hereto.

German priority application 198 07 031.5 is relied on and incorporated herein by reference.

We claim:

1. An air lock for continuous introduction into and/or removal of workpieces from an exterior space and a treatment space separated atmospherically with at least one transfer channel connecting the exterior space and the treatment space, comprising at least one lock chamber that can be moved between the exterior space and the treatment space and for housing at least one workpiece to be processed inside the transfer channel, wherein the lock chamber has an opening for loading and unloading workpieces, the lock chamber has at least one sealing device in cooperation with the inside wall of the transfer channel which seals the transfer channel interior off atmospherically from the exterior space and the treatment space during the passage through the air lock, wherein the treatment space contains at least one coating source, the workpieces being arranged so as to be moved in front of a coating source.

2. The air lock according to claim 1, wherein the exterior space and the treatment space have differing atmospheric pressures.

3. The air lock according to claim 1, wherein the exterior space has normal atmospheric pressure and the treatment space has a vacuum pressure.

4. The air lock according to claim 1 where in the treatment space is a vacuum-coating chamber, in which an atmospheric pressure of at most $10^{-3}$ mbar is set during a coating process.

5. The air lock according to claim 1, which is a carrousel lock and comprises a carrousel chamber with a transfer channel wheel, with a continuous rim, seated so as to rotate therein, wherein the at least one lock chamber is inserted in the continuous rim of the transfer channel wheel at the periphery with an opening for loading and unloading the transfer channel wheel with workpieces to be transferred.

6. The air lock according to claim 5, wherein the transfer channel wheel peripheral sealing devices are provided which have sealing elements which make contact with an inside channel wall of a transfer channel during a transfer process of substrates from a loading station (A) to a transfer station (B) or from a transfer station (G) to an unloading station (H) such that the lock chamber is separated atmospherically tight both from exterior and from substrate treatment space.

7. The air lock according to claim 6, wherein the transfer channel is constructed as a differential pressure stage, wherein the lock chamber pressure in the transfer channel, starting from the loading station (A) or the unloading station (H) in the exterior, decreases over the circumference of the transfer channel formed continuously between the transfer channel and the carrousel wheel in the direction of the transfer station (B) or the transfer station (G) from the atmospheric pressure prevailing in the exterior, which provides the reduced prevailing pressure in the treatment space.

8. The air lock according to claim 5 wherein the loading devices are provided for loading and/or unloading the transfer channel wheel with the workpieces which convey, by means of gripping devices, the untreated substrates into the lock chamber or the treated workpieces out of the lock chamber.

9. The air lock according to claim 1 wherein the coating source is a vaporization source and/or a sputtering cathode source for generating a cloud of vaporized and/or sputtered coating material for deposition onto the substrates to be coated.

* * * * *